United States Patent
Engelmann et al.

(10) Patent No.: US 8,232,171 B2
(45) Date of Patent: Jul. 31, 2012

(54) STRUCTURE WITH ISOTROPIC SILICON RECESS PROFILE IN NANOSCALE DIMENSIONS

(75) Inventors: Sebastian Ulrich Engelmann, Yorktown Heights, NY (US); Nicholas C. M. Fuller, Yorktown Heights, NY (US); Eric Andrew Joseph, Yorktown Heights, NY (US); Isaac Lauer, Yorktown Heights, NY (US); Ryan M. Martin, Yorktown Heights, NY (US); James Vichiconti, Yorktown Heights, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 12/561,704

(22) Filed: Sep. 17, 2009

(65) Prior Publication Data
US 2011/0062494 A1 Mar. 17, 2011

(51) Int. Cl.
*H01L 21/336* (2006.01)
(52) U.S. Cl. ........ 438/299; 438/197; 438/242; 438/690; 438/700; 438/759; 438/938

(58) Field of Classification Search .................. 438/700, 438/197, 242, 299, 690, 759, 938
See application file for complete search history.

(56) References Cited

U.S. PATENT DOCUMENTS 7,005,351 B2 * 2/2006 Henninger et al. .......... 438/268
* cited by examiner

*Primary Examiner* — Jay C Kim
(74) *Attorney, Agent, or Firm* — Scully, Scott, Murphy & Presser, P.C.; Louis J. Percello, Esq.

(57) ABSTRACT

A trench is formed by an anisotropic etch in a semiconductor material layer employing a masking layer, which can be gate spacers. In one embodiment, an adsorbed fluorine layer is provided at a cryogenic temperature only on vertical sidewalls of the semiconductor structure including the sidewalls of the trench. The adsorbed fluorine layer removes a controlled amount of the underlying semiconductor material once the temperature is raised above the cryogenic temperature. The trench can be filled with another semiconductor material to generate stress in the semiconductor material layer. In another embodiment, the semiconductor material is laterally etched by a plasma-based etch at a controlled rate while a horizontal portion of a contiguous oxide liner prevents etch of the semiconductor material from the bottom surface of the trench.

9 Claims, 6 Drawing Sheets

STRUCTURE WITH ISOTROPIC SILICON RECESS PROFILE IN NANOSCALE DIMENSIONS

This invention was made with United States government support under Contract No. FA8650-08-C-7806 awarded by Defense Advanced Research Projects Agency (DARPA). The United States government has certain rights in this invention.

BACKGROUND

This invention relates to methods of laterally offsetting sidewalls of a trench in a semiconductor substrate relative to sidewalls of overlying structures and structures formed by the same.

Etching in a vertical direction is an integral component of semiconductor processing technology. An isotropic etch employs wet chemicals or reactant gases that etch a material isotropically. The etch rate of isotropic etch processes are difficult to control on a nanoscale, i.e., on a scale from 0.1 nm to 10 nm, because the etch rate is sensitive to temperature and/or supply of etchant.

Plasma processing provides a more precise control of the etch rate. Plasma etch chambers are designed to etch anisotropically in a vertical direction. Advanced semiconductor chips require a high degree of profile control, where the extent of vertical etching may be difficult to control. The ion energy due to the plasma self-bias potential is the ultimately lowest ion energy attainable in plasma reactors, while still enabling a reasonable degree of vertical etching.

Known plasma-etch-based solutions to recessing silicon on a nanoscale generate a post-etch profile in which lateral silicon erosion in the horizontal direction can be up to about ⅓ of the silicon erosion in the vertical direction, i.e., in the direction of the impinging plasma. The amount of lateral etching relative to the depth of a trench formed by a plasma etch is limited. This constraint makes it difficult to enable useful features in semiconductor technology such as tunnel field effect transistor (FET) having strained semiconductor-on-insulator (SSOI) features, which may be a crucial component in obtaining sub-threshold slope characteristics below the classical limit of 60 mV/decade.

BRIEF SUMMARY

In an embodiment of the present invention, a trench is formed by an anisotropic etch in a semiconductor material layer employing a masking layer. An adsorbed fluorine layer is formed on the exposed surfaces of a semiconductor structure including the bottom surface and the sidewalls of the trench at a cryogenic temperature. A sputtering process performed at a cryogenic temperature removes horizontal portions of the adsorbed fluorine layer so that the remaining adsorbed fluorine layer is present only on vertical sidewalls of the semiconductor structure including the sidewalls of the trench. The temperature of the semiconductor structure is raised above the cryogenic temperature to enable reaction of the adsorbed fluorine layer with the semiconductor material in a lateral direction. The adsorbed fluorine layer removes a controlled amount of the underlying semiconductor material by chemically reacting and removing the semiconductor material. The amount of removal of the semiconductor material is in the range of monolayers of the semiconductor material, thereby providing a lateral etch by a nanoscale dimension.

In another embodiment of the present invention, a trench is formed by an anisotropic etch in a semiconductor material layer employing a masking layer, which can be gate spacers. The crystallographic orientations of the sidewalls of the trench are selected to provide a lower oxidation rate than the crystallographic orientation of the bottom surface of the trench. A contiguous oxide liner having a thicker bottom portion relative to thinner sidewall portions is formed by oxidation. The contiguous oxide liner is isotropically etched to remove the thinner sidewall portions. The semiconductor material is laterally etched by a plasma-based etch at a controlled rate in a chemistry that is somewhat selective to the oxide layer atop the horizontal surface, thereby preventing etch of the semiconductor material underneath the oxide layer. The remaining horizontal portion of the contiguous oxide is subsequently removed, and the trench can be filled with a different semiconductor material to provide stress to neighboring semiconductor regions, which can include a channel of a field effect transistor.

According to an aspect of the present invention, a method of forming a semiconductor structure is provided. The method includes forming a trench in a semiconductor material layer, and forming an adsorbed fluorine layer on vertical surfaces of the trench, while horizontal surfaces of the trench do not have adsorbed fluorine thereupon.

According to another aspect of the present invention, another method of forming a semiconductor structure is provided. The method includes forming a trench in a semiconductor material layer; forming a contiguous semiconductor oxide liner on sidewalls and a bottom surface of the trench; exposing sidewall surfaces of the trench by removing vertical portions of the contiguous semiconductor oxide liner while a remaining horizontal semiconductor oxide portion of the contiguous semiconductor oxide liner overlies a portion of the semiconductor material layer located underneath the trench; and laterally etching the sidewall surfaces of the trench while the remaining horizontal semiconductor oxide portion covers the portion of the semiconductor material layer located underneath the trench.

According to yet another aspect of the present invention, a semiconductor structure is provided. The semiconductor structure includes a gate structure located on a semiconductor material layer including a first semiconductor material, the gate structure including a gate dielectric, a gate conductor, and a gate spacer; a semiconductor material portion embedded in the semiconductor material layer, the semiconductor material portion including a second semiconductor material that is different from the first semiconductor material; and a non-planar interface region between the first semiconductor material and the second semiconductor material, wherein the non-planar interface region includes a first horizontal interface portion at a first depth from the gate dielectric, a second horizontal interface portion at a second depth from the gate dielectric, and a non-horizontal interface portion adjoined to the first horizontal interface portion and the second horizontal interface portion and underlying the gate spacer.

According to still another aspect of the present invention, another semiconductor structure is provided. The semiconductor structure includes a trench in a semiconductor material layer; and an adsorbed fluorine layer located on vertical surfaces of the trench, while horizontal surfaces of the trench do not have adsorbed fluorine thereupon.

DETAILED DESCRIPTION

As stated above, the present invention relates to methods of laterally offsetting sidewalls of a trench in a semiconductor substrate relative to sidewalls of overlying structures and structures formed by the same, which are now described in detail with accompanying figures. The drawings are not necessarily drawn to scale.

Figure 1:
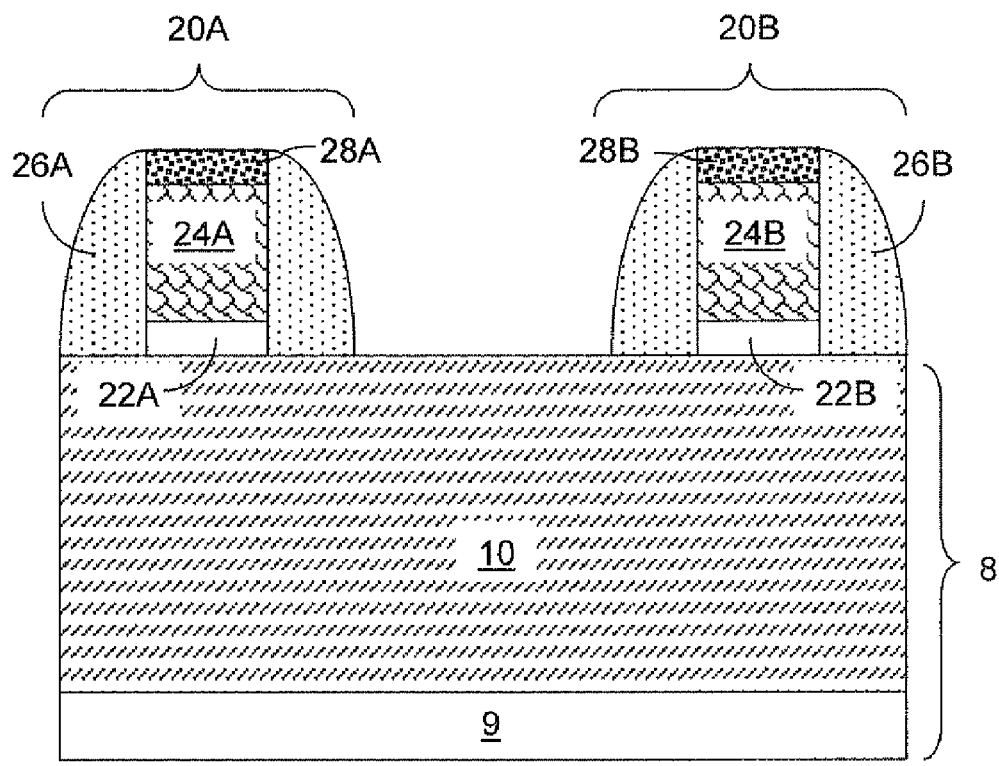
FIG. 1 is a vertical cross-sectional view of a first exemplary structure before formation of a trench according to a first embodiment of the present invention.

Referring to FIG. 1, a first exemplary structure according to a first embodiment of the present invention includes a substrate 8, a first gate structure 20A located on a top surface of the substrate 8, and a second gate structure 20B located on the top surface of the substrate 8 and laterally spaced from the first gate structure 20A. The substrate 8 includes a semiconductor material layer 10, which is comprised of a semiconductor material. The semiconductor material of the semiconductor material layer 10 can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the semiconductor material of the semiconductor material layer 10 is a single crystalline material. For example, the semiconductor material layer 10 can be a single crystalline silicon layer. The substrate 8 may include a buried insulator layer 9. Further, the substrate 8 may include a handle substrate (not shown) located beneath the buried insulator layer 9, if present.

The first gate structure 20A can include a first gate dielectric 22A, a first gate conductor 24A, a first gate spacer 26A, and a first dielectric cap 28A. The second gate structure 20B can include a second gate dielectric 22B, a second gate conductor 24B, a second gate spacer 26B, and a second dielectric cap 28B. The first and second gate dielectrics (22A, 22B) can be a silicon-oxide-based gate dielectric material or a high dielectric constant (high-k) dielectric material such as a dielectric metal oxide, having a dielectric constant greater than 4.0. The first and second gate conductors (24A, 24B) can be a doped semiconductor material, a metallic material, or a combination thereof. The first and second gate dielectrics (26A, 26B) can be a dielectric material such as silicon nitride, silicon oxynitride, or a combination of silicon oxide and silicon nitride. Preferably, the outer surfaces of the first and second gate dielectrics (26A, 26B) include a semiconductor nitride or a semiconductor oxynitride such as silicon nitride or silicon oxynitride. The first and second dielectric caps (28A, 28B) can be a dielectric material such as silicon nitride, silicon oxynitride, or a combination of silicon oxide and silicon nitride. Preferably, the top surfaces of the first and second dielectric caps (28A, 28B) include a semiconductor nitride or a semiconductor oxynitride such as silicon nitride or silicon oxynitride.

Figure 2:
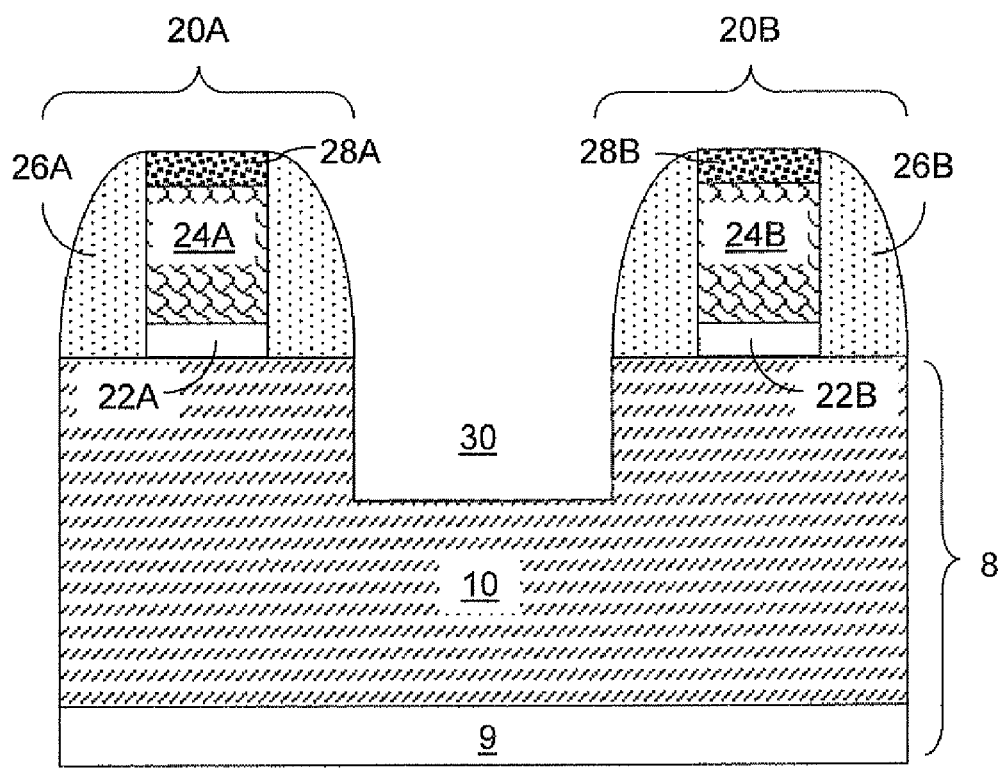
FIG. 2 is a vertical cross-sectional view of the first exemplary structure after forming a trench according to the first embodiment of the present invention.

Referring to FIG. 2, a trench 30 is formed by etching an exposed portion of the semiconductor material layer 10 between the first and second gate structures (20A, 20B). The trench 30 can be formed by an anisotropic etch that etches the semiconductor material of the semiconductor material layer 10 selective to the dielectric materials of the first and second gate spacers (26A, 26B) and the first and second dielectric caps (28A, 28B). If the buried insulator layer 9 is present, the depth of the trench 30 is selected to be less than the depth of the buried insulator layer 9. The trench 30 has a bottom surface and sidewalls. The bottom surface of the trench 30 is a horizontal surface, and the sidewalls of the trench 30 are typically substantially vertical. The periphery of the sidewalls of the trench 30 can coincide with outer peripheries of the first and second gate spacers (26A, 26B) at which the outer sidewalls of the first and second gate spacers (26A, 26B) contact a top surface of the semiconductor material layer 10.

Figure 3:
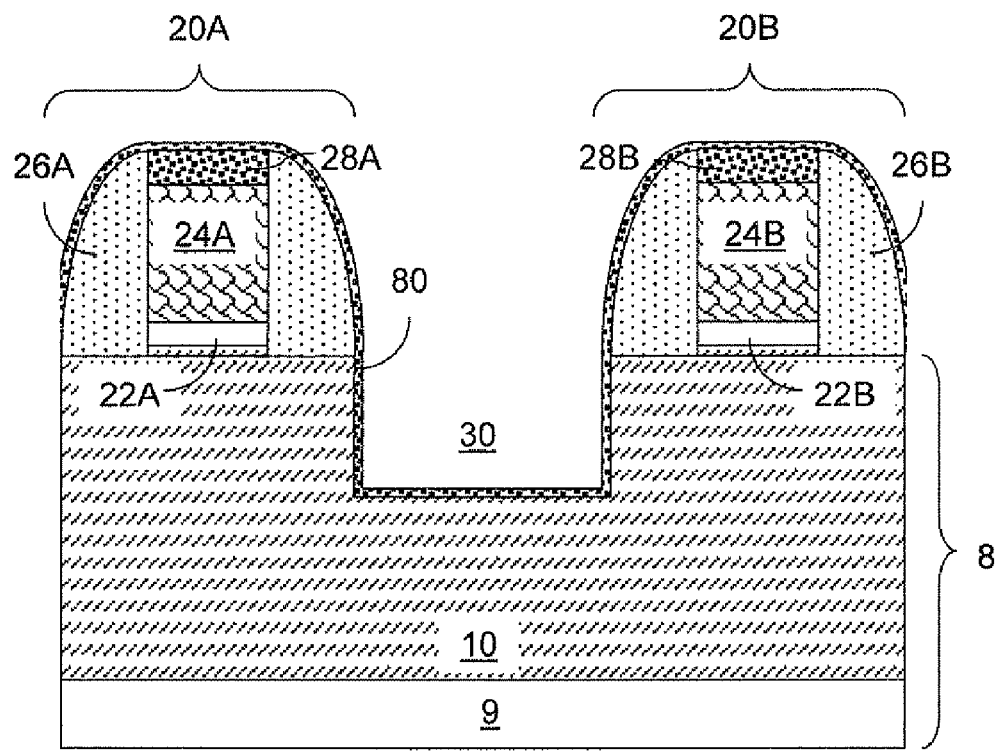
FIG. 3 is a vertical cross-sectional view of the first exemplary structure after forming a contiguous adsorbed fluorine layer according to the first embodiment of the present invention.

Referring to FIG. 3, the first exemplary structure is placed in a cryogenic environment, which has an ambient temperature below −40 degrees Celsius, and preferably below −100 degrees Celsius. Placement of the first exemplary structure in a cryogenic environment can be effected by providing a cryogenic chamber and inserting the first exemplary structure into the cryogenic chamber. Preferably, the cryogenic chamber is a vacuum enclosure that provides a cryogenic temperature and low residual gas pressure.

After the first exemplary structure is cooled below −40 degrees Celsius, and preferably below −100 degrees Celsius, the cryogenic chamber is filled with a fluorine-containing gas. The fluorine-containing gas includes any gas that contains fluorine atoms that adsorb to a surface at a cryogenic temperature. For example, the fluorine-containing gas can be, but is not limited to $F_2$, $CClF_3$, $CF_4$, $SF_6$, $XeF_2$, $CHF_3$, $CH_2F_2$, $CH_3F$, $C_4F_6$, $C_5F_8$, $C_4F_8$ or any combination thereof. A contiguous adsorbed fluorine layer 80 is formed on exposed surfaces of the first exemplary semiconductor structure at the cryogenic temperature because the fluorine-containing gas is adsorbed on the cold surfaces of the first exemplary structure. The surfaces on which the contiguous adsorbed fluorine layer 80 is formed include the bottom surface and the sidewalls of the trench 30. Typically, the contiguous adsorbed fluorine layer 80 contiguously extends over all of the exposed surfaces of the first exemplary semiconductor structure without a hole or a discontinuity. Thus, the contiguous adsorbed fluorine layer 80 is formed on all surfaces of the trench 30, i.e., on horizontal and vertical surfaces of the trench 30. The contiguous adsorbed fluorine layer 80 can be a monolayer of fluorine atoms that are atomically bonded to an underlying semiconductor material in the semiconductor material layer 10.

Figure 4:
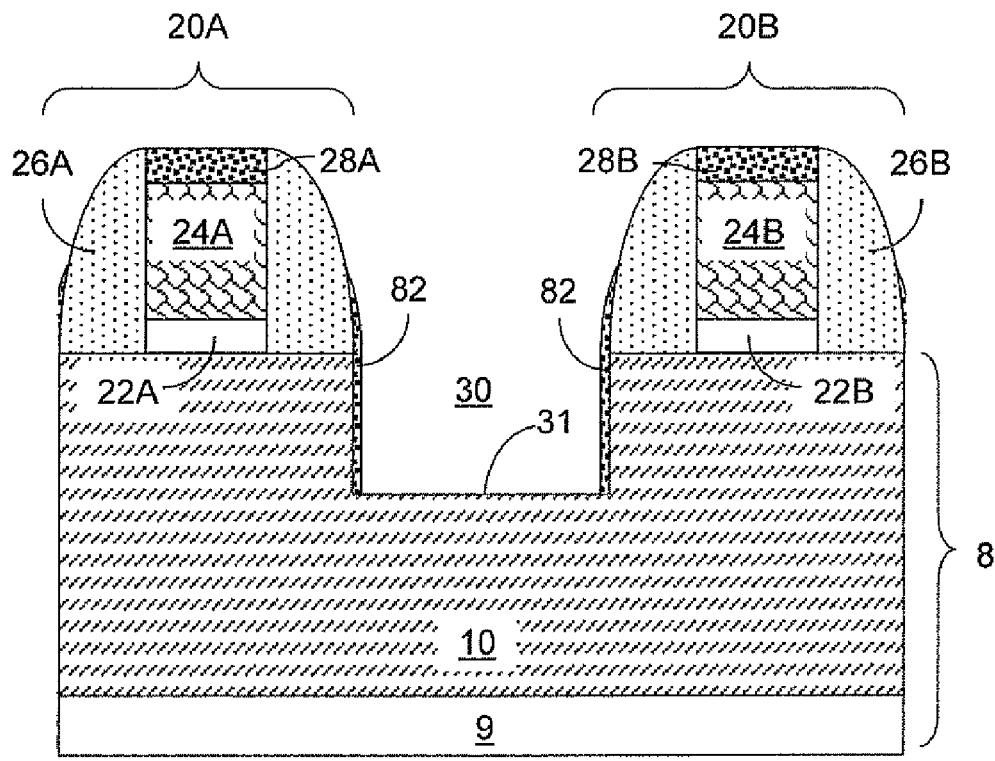
FIG. 4 is a vertical cross-sectional view of the first exemplary structure after removal of horizontal portions of the contiguous adsorbed fluorine layer to provide adsorbed fluorine layer present only on vertical surfaces according to the first embodiment of the present invention.

Referring to FIG. 4, horizontal portions of the contiguous adsorbed fluorine layer 80 are removed to provide adsorbed fluorine layers 82 that are present only on vertical surfaces of the first exemplary semiconductor structure. For example, the cryogenic chamber can be equipped with sputtering capability to provide ions that impinge upon the first exemplary structure in a direction that is substantially normal to the bottom surface 31 of the trench 30. Ions that can be employed to sputter and remove horizontal portions of the contiguous adsorbed fluorine layer 80 include, but are not limited to, Kr, He, Ne, Ar, Xe, $H_2$, $N_2$, and $O_2$. The ion sputtering destroys the chemical bonding between the adsorbed atoms and the underlying semiconductor material so that the horizontal surface of the trench 30 does not have adsorbed fluorine thereupon after the sputtering. Horizontal portions of the contiguous adsorbed fluorine layer 80 are thus removed, and vertical portions of the contiguous adsorbed fluorine layer 80 remain to constitute the adsorbed fluorine layers 82, which cover all of the vertical sidewalls of the trench 30 and a lower portion of the outer sidewalls of the first and second gate spacers (26A, 26B). Each of the adsorbed fluorine layers 82 contiguously extends over a vertical portion of an outer surface of one of the first and second gate spacers (26A, 26B). Preferably, the sputtering is performed at a cryogenic temperature below −40 degrees Celsius, and preferably below −100 degrees Celsius.

Alternately, the sputtering can be performed in another cryogenic chamber after transporting the first exemplary semiconductor structure into the other cryogenic chamber. Preferably, the ambient conditions of the first exemplary structure is maintained at a cryogenic temperature and in vacuum or in an inert ambient to prevent the contiguous adsorbed fluorine layer 80 from becoming volatile. After transfer of the first exemplary structure into the other chamber, ions impinge upon the first exemplary structure in a direction that is substantially normal to the bottom surface 31 of the trench 30 to remove the horizontal portions of the contiguous adsorbed fluorine layer 80. The remaining vertical portions of the contiguous adsorbed fluorine layer 80 constitute the adsorbed fluorine layers 82, which cover all of the vertical sidewalls of the trench 30 and a lower portion of the outer sidewalls of the first and second gate spacers (26A, 26B). The horizontal bottom surface of the trench 30 does not have adsorbed fluorine thereupon. Each of the adsorbed fluorine layers 82 contiguously extends over a vertical portion of an outer surface of one of the first and second gate spacers (26A, 26B). Preferably, the sputtering is performed at a cryogenic temperature below −40 degrees Celsius, and preferably below −100 degrees Celsius.

Figure 5:
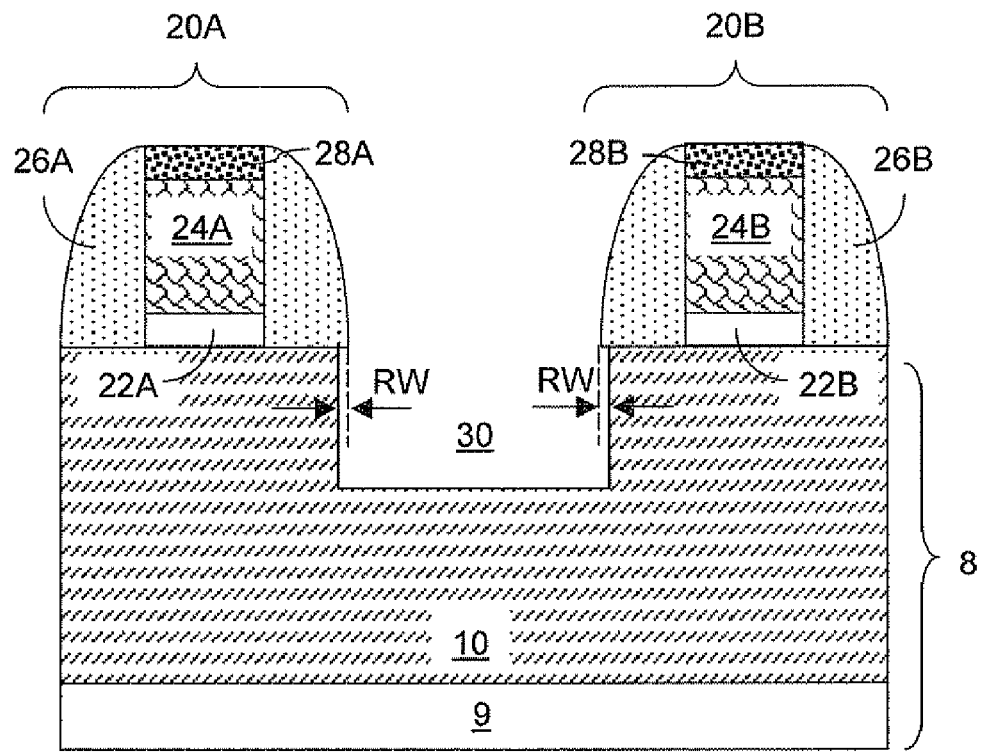
FIG. 5 is a vertical cross-sectional view of the first exemplary structure after lateral etching of the sidewalls of the trench according to the first embodiment of the present invention.

Referring to FIG. 5, the temperature of the first exemplary structure is raised above −40 degrees Celsius. For example, the first exemplary structure may be exposed to an ambient at a room temperature between 5 degrees Celsius and 35 degrees Celsius. As the temperature of the first exemplary structure is raised, the sidewalls of the trench 30 are laterally etched by the adsorbed fluorine layers 82. Specifically, the adsorbed fluorine layers 82 and the vertical surfaces of the trench 30 are subjected to a temperature at which the adsorbed fluorine layers 82 etch the underlying semiconductor material on the vertical surfaces of the trench 80 by reacting with the underlying semiconductor material of the semiconductor material layer 10. The amount of etched semiconductor material is measured in monolayers, and is typically from 1 to 4 atomic layers of the semiconductor material in the semiconductor material layer 10. Thus, the lateral recess width RW is from 0.3 nm to 1.5 nm depending on the crystallographic orientation of the semiconductor material at the sidewalls of the trench 30.

Figure 6:
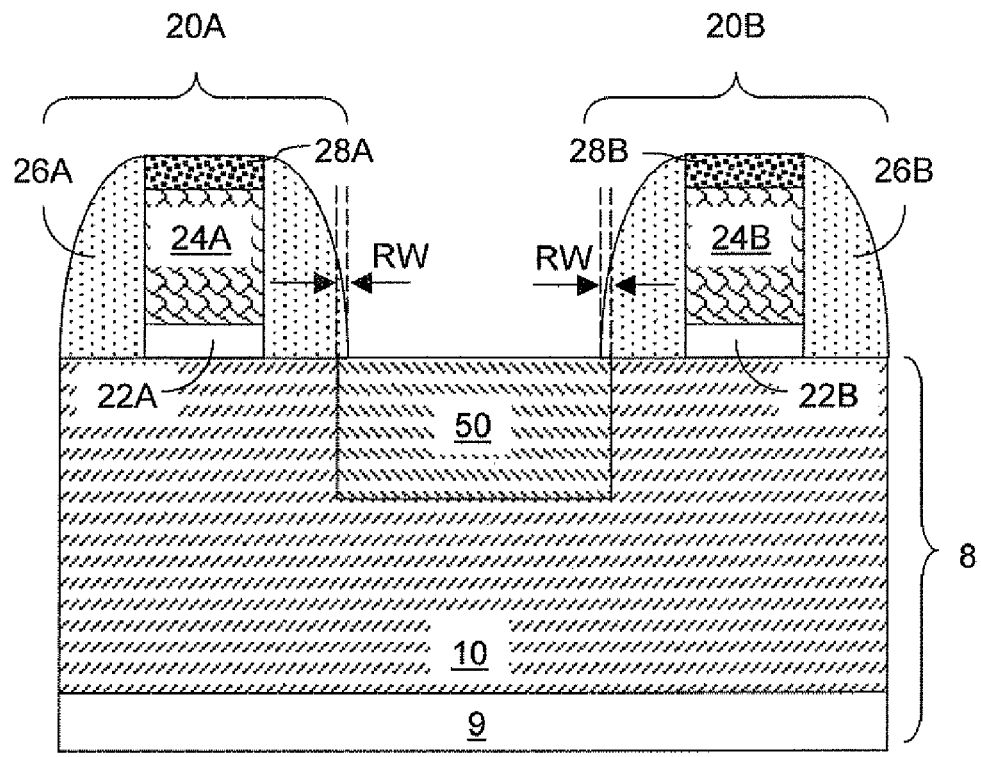
FIG. 6 is a vertical cross-sectional view of the first exemplary structure after formation of an embedded semiconductor material portion according to the first embodiment of the present invention.

Referring to FIG. 6, an embedded semiconductor material portion 50 is formed by filling the trench 30 with another semiconductor material, which is typically a different material than the semiconductor material of the semiconductor material layer 10. The semiconductor material of the embedded semiconductor material portion 50 can generate mechanical stress in a portion of the semiconductor material layer 10 located around the embedded semiconductor material portion 50.

The semiconductor material of the semiconductor material layer 10 and the semiconductor material of the embedded semiconductor material portion 50 can be single crystalline semiconductor materials that are epitaxially aligned to each other. The material of the embedded semiconductor material portion can be selected from, but is not limited to, a single crystalline silicon-germanium alloy, a single crystalline silicon-carbon alloy, and a single crystalline silicon-germanium-carbon alloy. The vertical interfaces between the semiconductor material layer 10 and the embedded semiconductor material portion 50 are laterally offset by the lateral recess width RW from outer peripheries of the first and second gate spacers (26A, 26B) at which the first and second gate spacers (26A, 26B) contact the embedded semiconductor material portion 50.

A second exemplary structure according to a second embodiment of the present invention is derived from the first exemplary structure in FIG. 2 according to the first embodiment of the present invention. In the second exemplary structure, a limitation is imposed on the crystallographic orientation of the bottom surface of the trench 30 and the crystallographic orientations of the sidewalls of the trench 30 at a step corresponding to FIG. 2. Specifically, the bottom surface of the trench 30 has a crystallographic orientation that provides a greater oxidation rate for the semiconductor material of the semiconductor material layer 10 than crystallographic orientations of the sidewalls of the trench 30. For example, if the semiconductor material layer 10 is a single crystalline silicon layer and the bottom surface of the trench 30 has a <111> orientation, and the sidewall surfaces of the trench 30 can have <110> orientation. Alternately, if the semiconductor material layer 10 is a single crystalline silicon layer and the bottom surface of the trench 30 has a <110> orientation, and the sidewall surfaces of the trench 30 can have a <100> orientation. In general, any combination of crystallographic orientations for the bottom surface and sidewalls of the trench 30 can be employed as long as the bottom surface of the trench 30 has a higher oxidation rate than the sidewalls of the trench 30. Alternatively, the bottom of said trench can by oxidized to a greater depth than the sidewalls by exposing the structure to an oxygen plasma, where the ion energy is greater than the plasma potential alone. Due to the geometry of the reactor, high energy ions will react with the bottom trench forming an oxide of thickness t1, whereas the sidewalls of the trench only react with plasma neutrals and scattered ions, forming a thinner oxide of thickness t2. Gate structures can be masked during this process. In this case, the crystallographic orientation of the bottom surface of the trench need not have a greater oxidation rate for thermal oxidation than sidewall surfaces of the trench because the geometry employed in the plasma oxidation induces greater oxidation rate on the bottom surfaces of the trench than on the sidewall surfaces of the trench.

Figure 7:
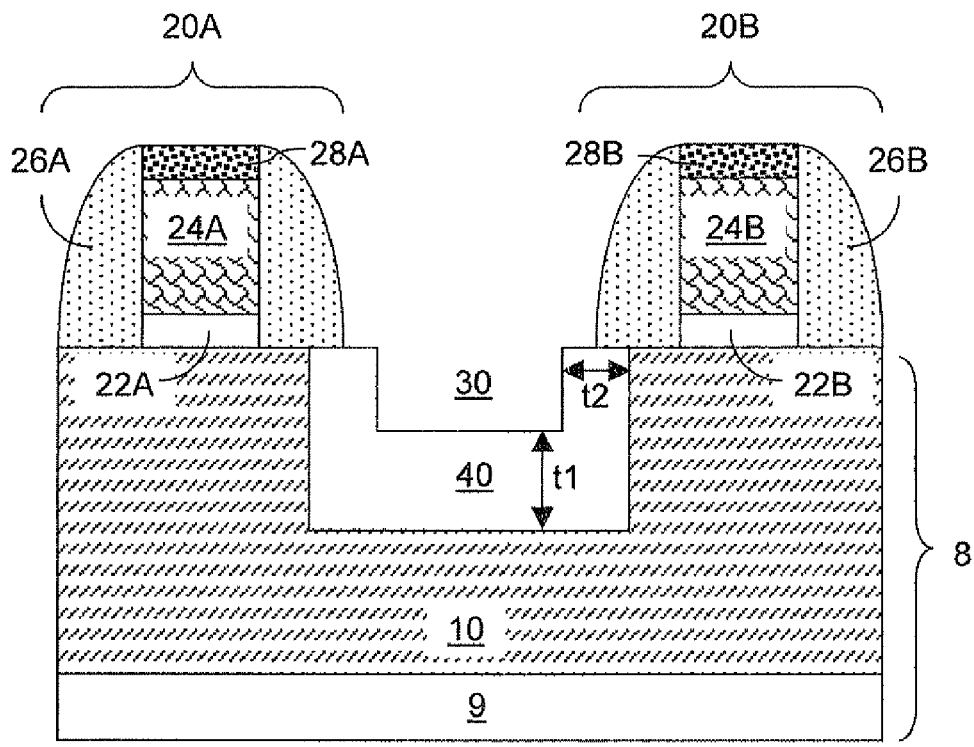
FIG. 7 is a vertical cross-sectional view of a second exemplary structure after forming a contiguous semiconductor oxide liner according to a second embodiment of the present invention.

Referring to FIG. 7, after a trench 30 is formed in the semiconductor material layer 10 of the second exemplary structure at a step corresponding to FIG. 2, a contiguous semiconductor oxide liner 40 is formed on all exposed surfaces of the trench 30 including the sidewalls and the bottom surface of the trench 30. The contiguous semiconductor oxide liner 40 is formed by converting the semiconductor material in the semiconductor material layer 10 into a semiconductor oxide. For example, if the semiconductor material in the semiconductor material layer 10 is silicon, the semiconductor oxide is silicon oxide. Because of the differential between the oxidation rates of the bottom surface and sidewalls of the trench 30, the first thickness t1 of the horizontal portion of the contiguous semiconductor oxide liner 40 is greater than the second thickness t2 of the vertical portions of the contiguous semiconductor oxide liner 40.

Figure 8:
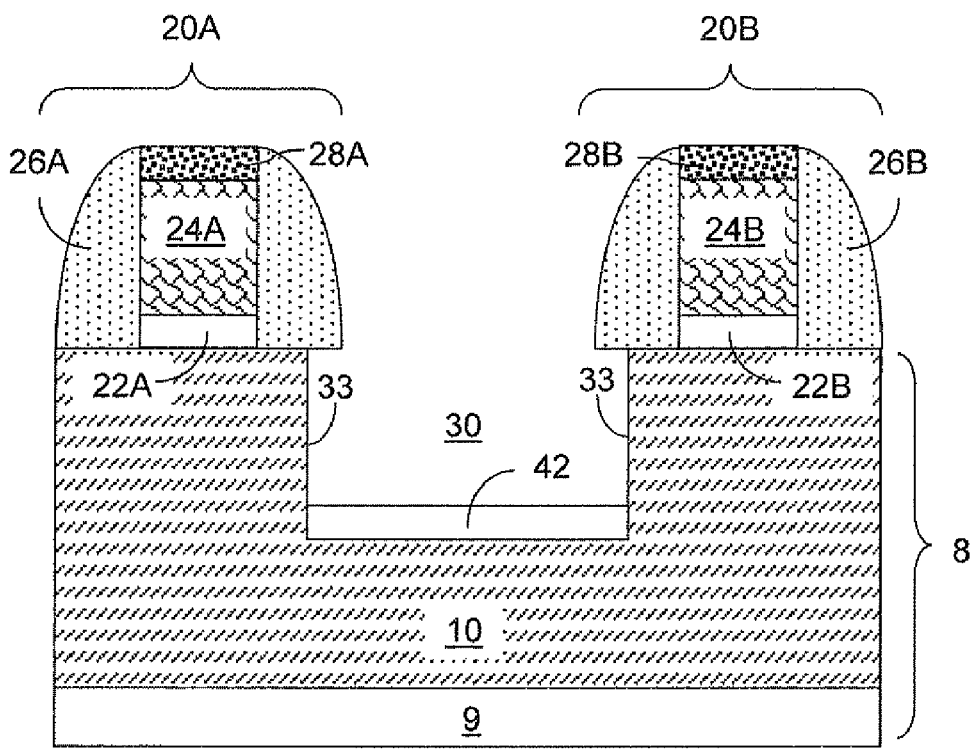
FIG. 8 is a vertical cross-sectional view of the second exemplary structure after removing vertical portions of the contiguous semiconductor oxide liner according to the second embodiment of the present invention.

Referring to FIG. 8, vertical portions of the contiguous semiconductor oxide liner 40 are removed, for example, by an isotropic etch. The isotropic etch can be a wet etch or a dry etch. In case a wet etch is employed, a dilute hydrofluoric acid can be employed to provide a slow etch rate if the contiguous semiconductor oxide liner 40 includes silicon oxide, a germanium oxide, or silicon-germanium oxide. In case the isotropic etch is a dry etch, an etchant gas such as HCl, $SF_6$, $XeF_2$, $CF_4$ or $NF_3$ can be employed.

The duration of the etch is controlled so that the amount of removal of the contiguous semiconductor oxide liner 40 is greater than the second thickness t2 and is lesser than the first thickness t1. Thus, sidewall surfaces 33 of the trench are exposed as vertical portions of the contiguous semiconductor oxide liner 40 are removed by the etch process. A remaining horizontal semiconductor oxide portion of the contiguous semiconductor oxide liner 40, which is herein referred to as a horizontal semiconductor oxide portion 42, overlies the portion of the semiconductor material layer 10 located underneath the trench 42. Edges of the horizontal semiconductor oxide portion 42 contact the sidewall surfaces 33 of the trench 30 at this step.

Figure 9:
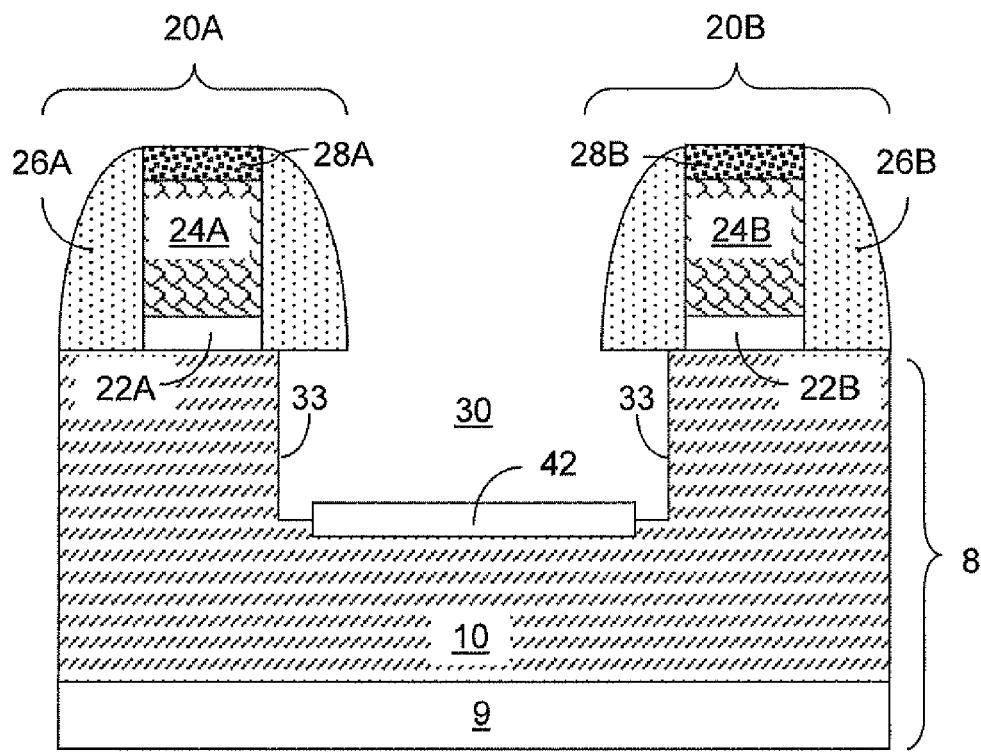
FIG. 9 is a vertical cross-sectional view of the second exemplary structure after laterally etching a semiconductor material employing a horizontal semiconductor oxide portion according to the second embodiment of the present invention.

Referring to FIG. 9, the exposed semiconductor material on the sidewall surfaces 33 of the trench 30 is laterally etched while the horizontal semiconductor oxide portion 42 covers the portion of the semiconductor material layer 10 located underneath the trench 30, thereby preventing etching of the semiconductor material underneath the bottom surface of the trench 30. The sidewall surfaces 33 of the trench 30 can be laterally etched by a dry etch or a wet etch. Preferably, the sidewall surfaces 33 of the trench 30 are laterally etched by a plasma etch, which is a dry etch. In case a plasma etch is employed to etch the sidewall surfaces 33 of the trench 30, the etch process can benefit from a precision control of the etch rate and enhanced uniformity of the etch rate, which are typically associated with the plasma etch. The sidewall surfaces 33 of the trench 30 are laterally etched while the horizontal semiconductor oxide portion 42 remains at the bottom of the trench 30. Because the lateral etch makes the sidewall surfaces 33 of the trench recede from the original positions as the etch progresses, the horizontal semiconductor oxide portion 42 does not cover a peripheral portion of the bottom surface of the trench 30 as the lateral etch progresses.

Figure 10:
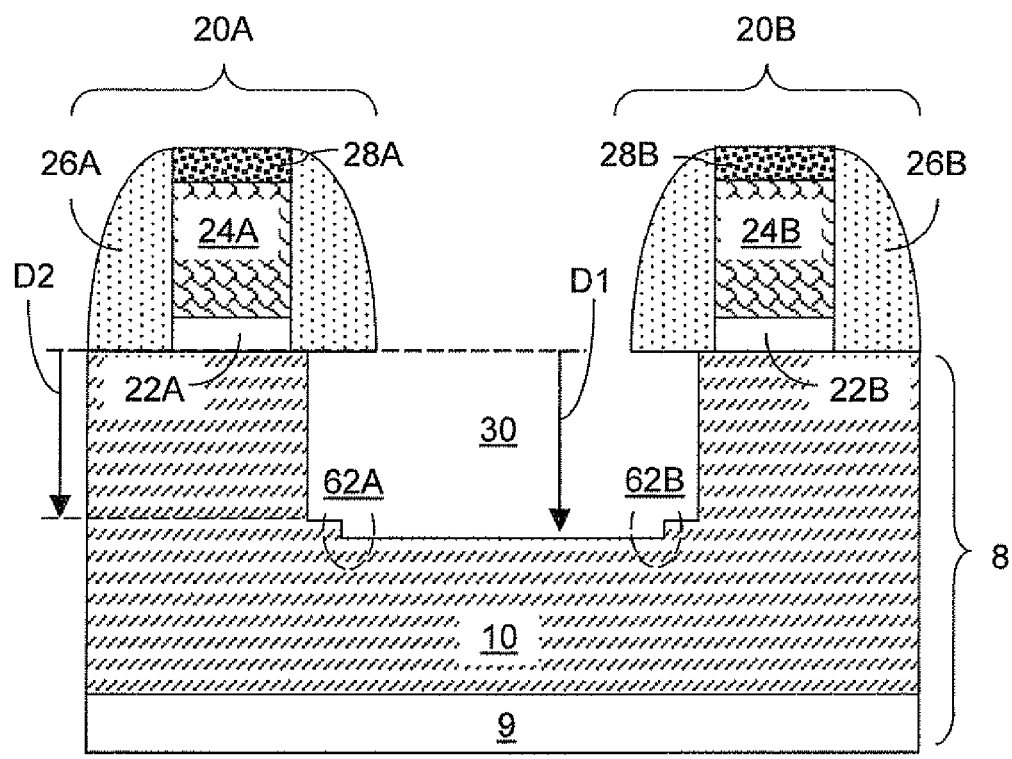
FIG. 10 is a vertical cross-sectional view of the second exemplary structure after removing the horizontal semiconductor oxide portion according to the second embodiment of the present invention.

Referring to FIG. 10, the horizontal semiconductor oxide portion 42 is removed to expose the portion of the semiconductor material layer 10 located underneath. The horizontal semiconductor oxide portion 42 can be removed selective to the semiconductor material layer 10. For example, if the horizontal semiconductor oxide portion 42 includes silicon oxide, germanium oxide, or a silicon-germanium oxide, the horizontal semiconductor oxide portion 42 can be removed by a wet etch employing a hydrofluoric acid (HF) solution or a dry etch employing HF in a vapor phase.

The center portion of the trench 30 can have a first depth D1, and the peripheral portions of the trench 30 can have a second depth D2. The central portion of the trench 30 corresponds to the area over which the horizontal semiconductor oxide portion 42 is present during the lateral etch of the trench 30. The peripheral portions of the trench corresponds to the area over which the horizontal semiconductor oxide portion 42 is not present during the lateral etch of the trench 30. When the first depth D1 is not the same as the second depth D2, a first non-planar surface region 62A is formed on the side of the first gate stack 20A, and a second non-planar surface region 62B is formed on the side of the second gate stack 20B. Each of the first and second non-planar surface regions (62A, 62B) includes a sub-region having the first depth D1 and a sub-region having the second depth D2.

Figure 11:
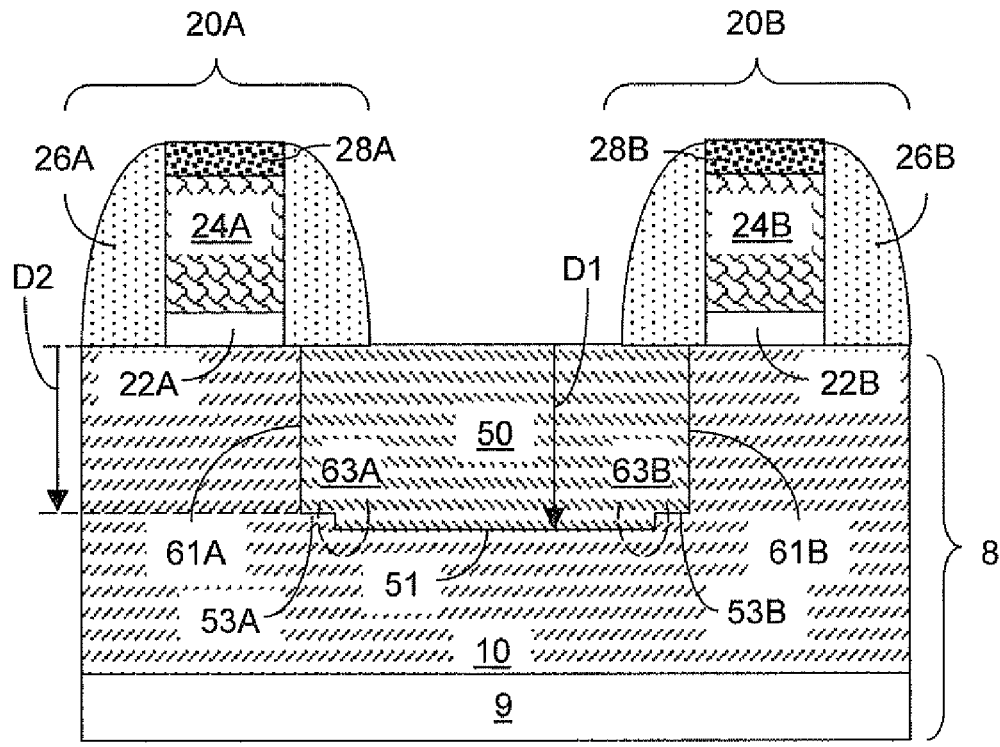
FIG. 11 is a vertical cross-sectional view of the second exemplary structure after formation of an embedded semiconductor material portion according to the second embodiment of the present invention.

Referring to FIG. 11, an embedded semiconductor material portion 50 is formed by filling the trench 30 with another semiconductor material, which is typically a different material than the semiconductor material of the semiconductor material layer 10. The semiconductor material of the embedded semiconductor material portion 50 can generate mechanical stress in a portion of the semiconductor material layer 10 located around the embedded semiconductor material portion 50.

The semiconductor material of the semiconductor material layer 10 and the semiconductor material of the embedded semiconductor material portion 50 can be single crystalline semiconductor materials that are epitaxially aligned to each other. The material of the embedded semiconductor material portion can be selected from, but is not limited to, a single crystalline silicon-germanium alloy, a single crystalline silicon-carbon alloy, and a single crystalline silicon-germanium-carbon alloy.

The embedded semiconductor material portion 50 contacts the semiconductor material layer 10 at a first horizontal interface located at the first depth D1 from the first and second gate dielectrics (22A, 22B) and at a second horizontal interface located at the second depth D2 from the first and second gate dielectrics (22A, 22B). A first non-planar interface region 63A is formed on the side of the first gate stack 20A, and a second non-planar interface region 63B is formed on the side of the second gate stack 20B. Each of the first and second non-planar interface regions (63A, 63B) includes a portion of a first horizontal interface, i.e., a "first horizontal interface portion," a portion of a second horizontal interface, i.e., a "second horizontal interface portion," and a non-horizontal interface portion adjoined to the first horizontal interface portion and the second horizontal interface portion. The first non-planar interface region 63A underlies the first gate spacer 26A, and the second non-planar interface region 63B underlies the second gate spacer 26B.

Further, the embedded semiconductor material portion 50 contacts the semiconductor material layer 10 at a first vertical interface located underneath the first gate spacer 26A and at second vertical interface located underneath the second gate spacer 26B. In other words, the first vertical interface underlies the first gate spacer 26A, and the second vertical interface underlies the second gate spacer 26B.

Figure 12:
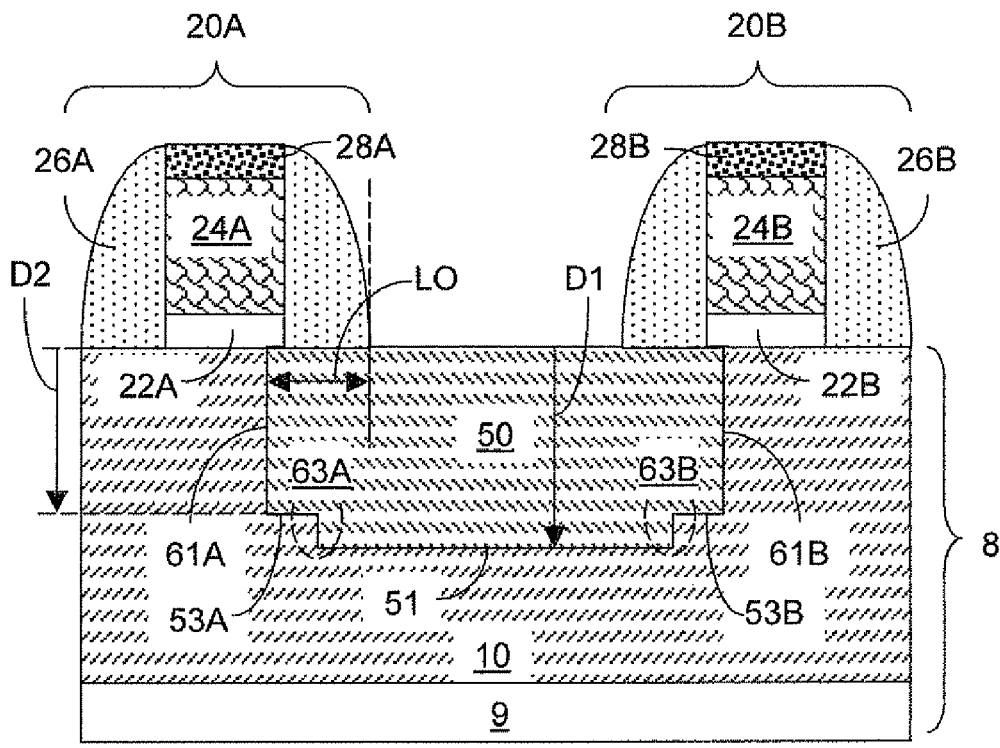
FIG. 12 is a vertical cross-sectional view of a variation of the second exemplary structure after formation of an embedded semiconductor material portion according to the second embodiment of the present invention.

Referring to FIG. 12, a variation of the second exemplary structure is shown, in which the first vertical interface and the second vertical interface between the embedded semiconductor material portion 50 contacts the semiconductor material layer 10 can be moved further from the outer peripheries of the first and second gate spacers (26A, 26B). The lateral offset LO is the most proximal lateral distance between each of the first and second vertical interfaces and the outer peripheries of the first and second gate spacers (26A, 26) at which the first and second gate spacers contact the embedded semiconductor material portion 50. The lateral offset LO can be increased by increasing the time period of the lateral etch of the sidewall surfaces 33 of the trench 30 at a step corresponding to FIG. 9.

In the variation of the second exemplary structure, the lateral offset LO is greater than the lateral width of the bottom portions of the first and second gate spacers (26A, 26B). Correspondingly, the first vertical interface underlies the first gate dielectric 22A, and the second vertical interface underlies the second gate dielectric 22B. The embedded semiconductor material portion 50 contacts bottom surfaces of the first and second gate dielectrics (22A, 22B).

The present invention can be practiced with any number of gate structures or without any gate structure. Further, shallow trench isolation structures including a dielectric material can be employed in each of the first and second exemplary structures.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    forming a trench in a semiconductor material layer;
    forming a contiguous semiconductor oxide liner on sidewalls and a bottom surface of said trench;
    exposing sidewall surfaces of said trench by removing vertical portions of said contiguous semiconductor oxide liner while a remaining horizontal semiconductor oxide portion of said contiguous semiconductor oxide liner overlies a portion of said semiconductor material layer located underneath said trench; and
    laterally etching said sidewall surfaces of said trench while said remaining horizontal semiconductor oxide portion covers said portion of said semiconductor material layer located underneath said trench, wherein said semiconductor material layer has a first semiconductor material, and said method further comprises filling said trench with a second semiconductor material that is different from said first semiconductor material, wherein said second semiconductor material generates mechanical stress in a portion of said semiconductor material layer around said second semiconductor material, and wherein said second semiconductor material is selected from a single crystalline silicon-germanium alloy, a single crystalline silicon-carbon alloy, and a single crystalline silicon-germanium-carbon alloy.

2. The method of claim 1, wherein said contiguous semiconductor oxide liner is formed by converting said first semiconductor material in said semiconductor material layer into a semiconductor oxide material.

3. The method of claim 2, wherein the first semiconductor material of said semiconductor material layer located at said bottom surface of said trench has a crystallographic orientation that provides a greater oxidation rate than crystallographic orientations of said sidewalls or said bottom surface is formed by exposing said trench to an oxygen-containing plasma having ion energies greater than a plasma potential.

4. The method of claim 1, further comprising forming a first gate structure and a second gate structure, wherein each of said first and second gate structure includes a gate dielectric, a gate conductor, and a gate spacer, and said sidewalls of said trench contact outer peripheries of said gate spacers upon formation of said sidewalls.

5. The method of claim 1, wherein said sidewall surfaces of said trench are laterally etched by a plasma etch.

6. A method of forming a semiconductor structure comprising:
    forming a trench in a semiconductor material layer;
    forming a contiguous semiconductor oxide liner on sidewalls and a bottom surface of said trench;
    exposing sidewall surfaces of said trench by removing vertical portions of said contiguous semiconductor oxide liner while a remaining horizontal semiconductor oxide portion of said contiguous semiconductor oxide liner overlies a portion of said semiconductor material layer located underneath said trench;
    laterally etching said sidewall surfaces of said trench while said remaining horizontal semiconductor oxide portion covers said portion of said semiconductor material layer located underneath said trench; and
    forming a first gate structure and a second gate structure, wherein each of said first and second gate structure includes a gate dielectric, a gate conductor, and a gate spacer, and said sidewalls of said trench contact outer peripheries of said gate spacers upon formation of said sidewalls.

7. The method of claim 6, wherein said contiguous semiconductor oxide liner is formed by converting a semiconductor material in said semiconductor material layer into a semiconductor oxide material.

8. The method of claim 6, wherein said semiconductor material layer has a first semiconductor material, and said method further comprises filling said trench with a second semiconductor material that is different from said first semiconductor material, wherein said second semiconductor material generates mechanical stress in a portion of said semiconductor material layer around said second semiconductor material.

9. The method of claim 6, wherein said sidewall surfaces of said trench are laterally etched by a plasma etch.

* * * * *